United States Patent [19]

Lindner

[11] Patent Number: 4,767,489
[45] Date of Patent: Aug. 30, 1988

[54] COMPUTER AIDED PRINTER-ETCHER

[75] Inventor: Frederick H. Lindner, Canaan, N.H.

[73] Assignee: PC Proto, Inc., Hanover, N.H.

[21] Appl. No.: 29,923

[22] Filed: Mar. 25, 1987

[51] Int. Cl.⁴ .............................. C23F 1/02; B44C 1/22; C03C 15/00; G06F 15/606

[52] U.S. Cl. .................................... 156/345; 156/642; 156/656; 156/659.1; 156/902; 346/140 R; 364/489

[58] Field of Search ............... 156/345, 640, 642, 639, 156/656, 659.1, 666, 902; 364/489, 500; 346/140 R; 101/45, 93.04, 93.08, 103, 327, 364, 368, 425

[56] References Cited

U.S. PATENT DOCUMENTS

| | | | |
|---|---|---|---|
| 4,389,275 | 6/1983 | Ballato | 156/345 X |
| 4,523,973 | 6/1985 | Nelson | 156/345 X |
| 4,552,614 | 11/1985 | Beckett | 156/345 X |
| 4,588,468 | 5/1986 | McGinty et al. | 156/345 |
| 4,720,798 | 1/1988 | Reed et al. | 156/659.1 X |

Primary Examiner—William A. Powell
Attorney, Agent, or Firm—Sughrue, Mion, Zinn, Macpeak and Seas

[57] ABSTRACT

A computer aided printer-etcher has a computer connected electrically to a printer etcher unit, such that the printer etcher unit is controlled by the computer through the keyboard and computer memory. The printer etcher unit mounts an etching chamber within a cabinet. A conveyor within the cabinet defining a conveyor film path for a metallized film which path includes a vertically oblique portion within the etching chamber. A high speed printer upstream of the etching chamber and on the conveyor film path applies a resist ink pattern onto the metal surface of the metalized film. A liquid applicator mounted downstream of the printer applies in sequence an etching liquid and a rinse liquid onto the metalized film to etch the exposed metal but not the metal covered by the resist ink pattern. The printer may be an ink jet printer. The resist may be a meltable or thermoplastic material applied as molten drops which solidify to lock out the etching liquid. A viewing window is provided within the cabinet for viewing the metalized film during droplet application of the etchant liquid and the rinse liquid. The applied liquids drain to the bottom of the etching chamber by gravity and flow to a respective etching liquid holding tank or rinse liquid holding tank through drain holes within the bottom wall of the etching chamber which are selectively closed by stopper solenoids.

21 Claims, 3 Drawing Sheets

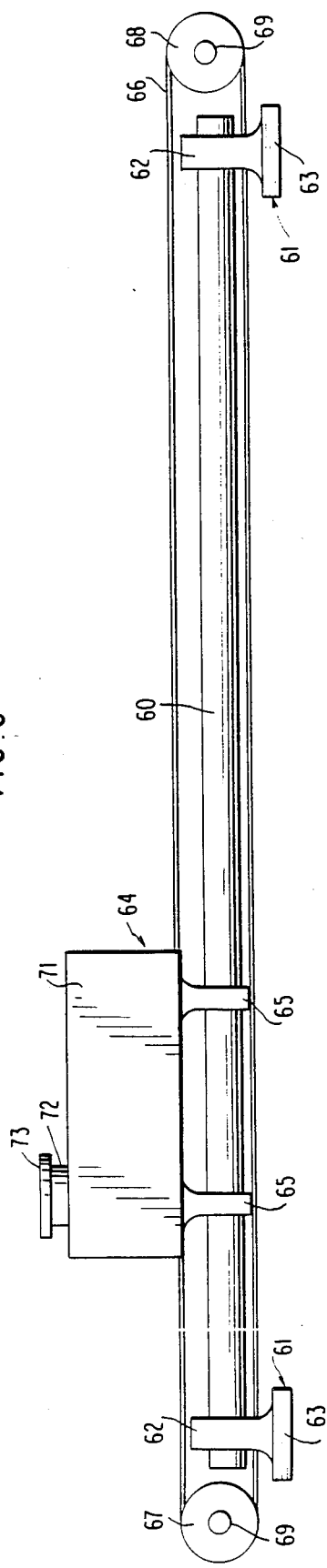
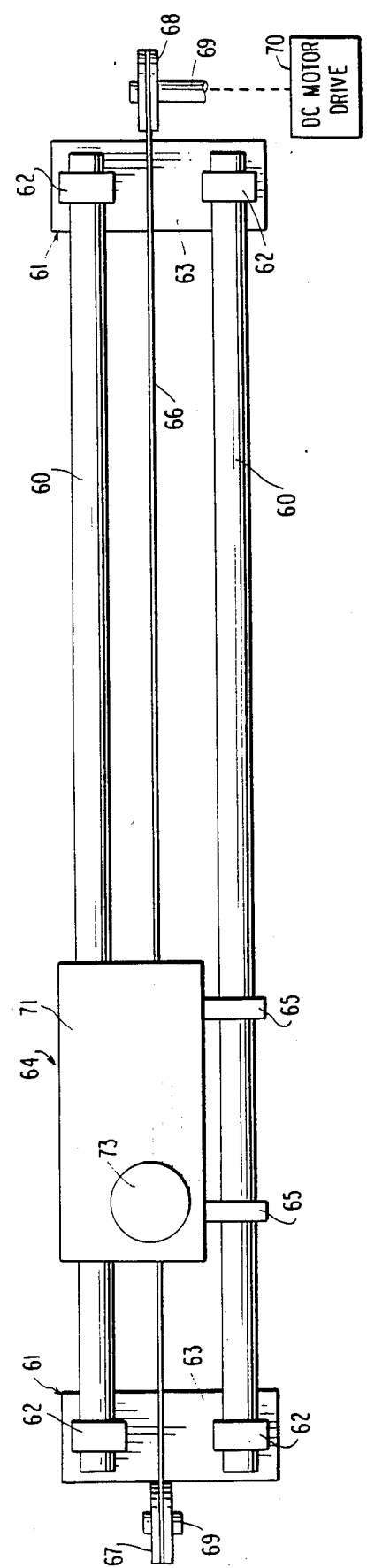
FIG. 3
FIG. 4

COMPUTER AIDED PRINTER-ETCHER

FIELD OF THE INVENTION

This invention relates to the manufacture of printed circuit boards and more particularly to a computer aided printer-etcher (prototyper) for controlling the resist pattern printed on a sheet metal surface combined with a succeeding etching step to permit the rapid production of a single prototype or experimental printed circuit board.

BACKGROUND OF THE INVENTION

Printed circuit boards in which the circuit conductors are fixed may be rapidly mass produced. However there is no known system in use for the production of a single prototype or experimental printed circuit board without going through the expensive and laborious photographic process using masking, photographic exposure, resist techniques and the like with multiple step etching.

The applicant has devised a relatively small, compact computer aided printer-etcher unit to facilitate the expeditious, simplified and rapid manufacture of such single prototype or experimental printed circuit board.

The applicant is aware of a number of U.S. patents which are directed to the utilization of a computer aided device (CAD) as a variable input device to both automate and reduce the time and effort necessary to accomplish the production of printed circuit boards integrated circuits or the like.

U.S. Pat. No. 3,567,914 is directed to an automated manufacturing system which deals with the manufacture of printed circuits and discloses a system which eliminates the hand method of layout by integrating a general purpose computer to create a master record of manufactured wiring data and the use of that data by wire routing control data feed to the manufacturing process to create a wired assembly. The use of such a manufacturing system eliminates the necessity of a designer preparing a master drawing or layout of the desired configuration of the conductor paths by hand where the designer is forced to consider every connection necessary in the paths which are available to make the conductor runs prior to the process of plating copperconductor strips or depositing copper foil on various types of laminate or base material to achieve the conductor layout.

U.S. Pat. No. 3,601,590 teaches, in an automated system, the feeding of artwork information from a coordinate read-out table into a digital computer which computer sends such data to the automated layout drafting table to reproduce the artwork information on master mats by a rotary tool mechanism. The production of master mats is employed in the manufacture of miniature electronic circuits. It eliminates a number of steps for transposing the circuits from the engineering and design circuit to the production equipment circuit. The system has application to circuits which are produced through photographic processes, reduced in size from the original master mats with the masters being produced on synthetic master mat material from original circuit concepts provided on drafting paper.

U.S. Pat. No. 4,477,484 is directed to an automated apparatus for determining the initiation, projection and quality electroless plated blind holes or through holes in printed circuit panels. The system uses a test coupon for monitoring the plating having a sensitized initiation conductivity zone and sensitized through hole walls in which the test coupon is measured periodically as to resistivity to determine the start or termination of electroless plating.

U.S. Pat. No. 4,496,607 teaches the use of a computer programmed to move an XY table in a manner to allow a laser beam to melt the surface of the substrate in a pattern of 10 centimeter long parallel lines to create a printed circuit or other electrically conductive circuit on an insulator board. The laser beam melts a tracing of the circuit onto the dielectric while simultaneously impacting metal particles into the trace molten tracks.

U.S. Pat. No. 4,600,996 employs a computer aided design system for drawing a mask, using a mask drawing apparatus to produce circuit patterns for large scale integrated (LSI) circuits by electron beams and in turn controlling a mask inspection apparatus to determine whether the circuit patterns are correctly drawn by the mask drawing apparatus.

From the above patents, it can be seen that computers or data processors have broad application in the design field and computer aided design (CAD) systems have been changing the manner in which electronic designing is accomplished. Such systems allow schematics and artwork to be entered directly from the keyboard into the process of manufacturing of the prototype. In the manufacture of printed circuits, the engineering process remains about the same. Engineers prototype their designs to verify the schematics under the laborious process of depositing resist material onto metal surfaces with the resist being impervious to the chemicals used in the etch phase of the operation. Where, several resist/etch steps are necessary the process is complicated and time consuming. The latter steps involve significant time and moderate expense.

It is therefore an object of the present invention to provide an apparatus for producing prototype printed circuit boards quickly and inexpensively which may be controlled and facilitated via a printer or a plotter output of a CAD system to produce a one-to-one scale version of the desired printed circuit on a thin metal film which may be moved quickly through an etcher integrated to the printer and in which, the printer deposits a resist pattern correlated to the design circuit directly on the thin metal film.

SUMMARY OF THE INVENTION

The present invention is directed to applying computer aided device (CAD) to a printed circuit prototyper (PCP) to create a modified temporary printed circuit board capable of further testing. The artwork of the CAD system is fed via a printer or plotter output port to the PCP to produce a one-to-one scale version of the prototype printed circuit. The CAD system feeds via an electronic interface to the PCP's print mechanism for printing a resist ink directly on a thin, copper coated polyester film which is movable past the print mechanism and in sequence to an etching and rinse station integrated to the PCP.

Preferably, the printed circuit prototyper (PCP) may comprise an "ink-melt" type printer in which the ink-melt printer melts a wax or thermoplastic material and delivers it to the print substrate (copper coated polyester film) in microscopic dots which later cool on the substrate and function to lock out the subsequently applied etch liquid.

BRIEF DESCRIPTION OF THE DRAWINGS

FIG. 3 is a schematic side elevational view of the print head and carriage forming principal components of the printed circuit prototyper.

FIG. 4 is a top plan view of the print head and carriage of FIG. 3.

DESCRIPTION OF THE PREFERRED EMDODIMENT

Figure 1:
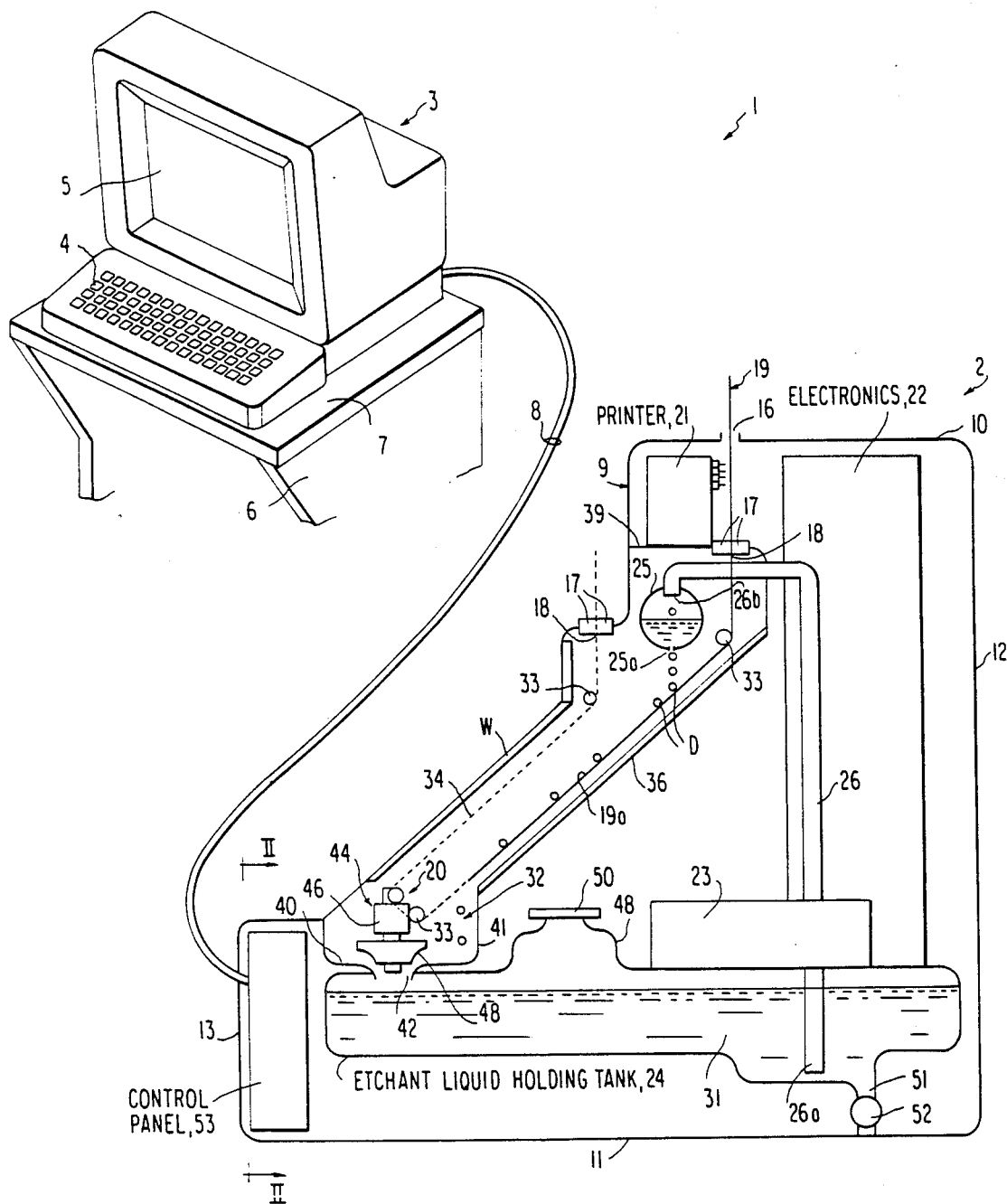
FIG. 1 is a combined partial schematic sectional view and a partial perspective view of the computer aided printer-etcher forming a preferred embodiment of the invention, taken about a line I—I of FIG. 2.

Referring to the drawings, there is shown in FIG. 1, a computer aided printer-etcher system indicated generally at 1 is comprised of two basic units, the printed circuit prototyper or printer-etcher unit 2 (in schematic vertical section) and the computer or data processor indicated generally at 3, (shown in perspective form) and being electrically connected to the printer-etcher via leads 8. The computer or data processor 3 is table mounted via stand 6, resting on stand top 7. The computer or data processor 3 includes a keyboard 4 for input purposes and a screen 5 to display data representative of the circuit information to be incorporated within the prototype printed circuit board or graphically, the circuit so incorporated.

Figure 2:
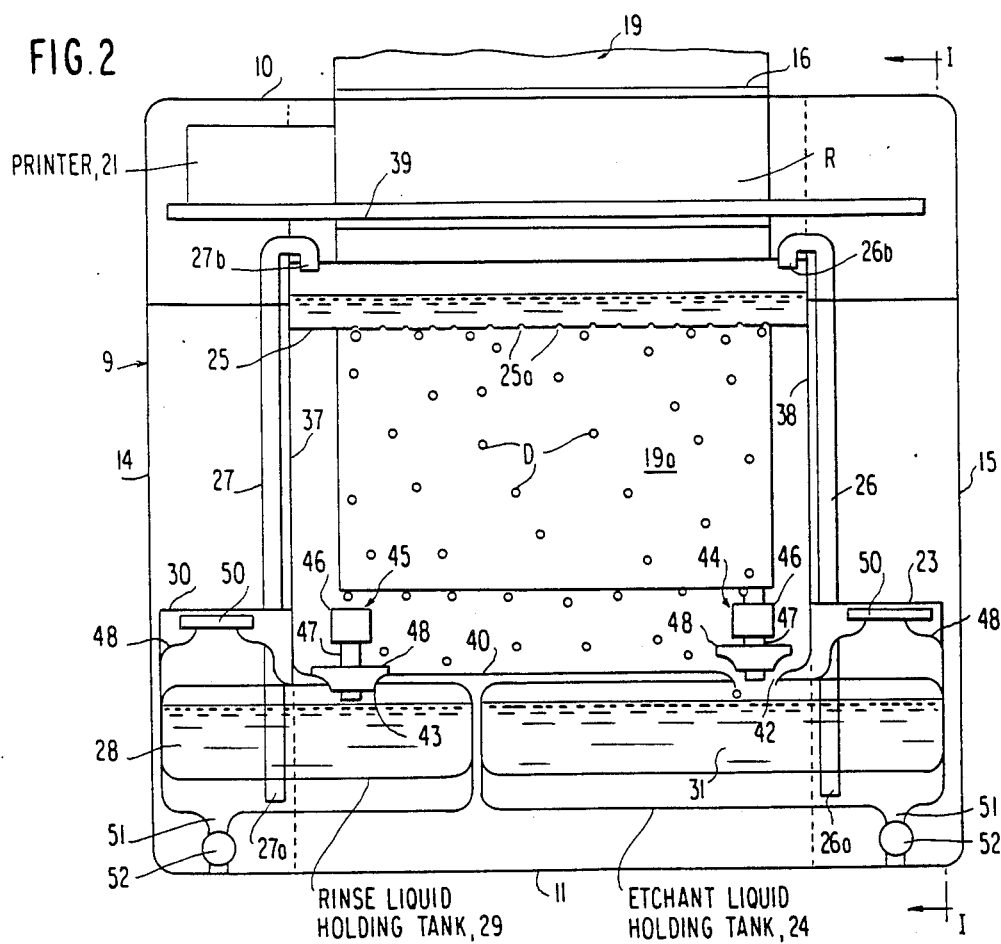
FIG. 2 is a vertical sectional view of the computer aided printer-etcher, taken about a line II—II of FIG. 1.

With respect to the printer-etcher unit 2, it consists of a external cabinet or housing indicated generally at 9, having a top wall 10, a bottom wall 11, a rear wall 12 and a front wall 13, (FIG. 1) and laterally opposed vertical side walls 14, 15 (FIG. 2). The cabinet or housing 9 includes an elongated horizontal slot or opening 16 within the top wall 10, through which passes a metalized film sheet 19 which is fed downwardly through a first set of seals 17 via a gap 18 therebetween, into an etching chamber indicated generally at 32. Sheet 19 moves outwardly of the cabinet, through a further pair of elongated strip seals 17 via a similar slot 18 between those seals after processing of the metalized film 19. Transport of the metalized film is effected by a transfer system or conveyor 20 which will be described in detail hereinafter.

Within the printer-etcher unit 2, there are a number of principal components including a printer mechanism 21, the electronics of the system indicated schematically in block form at 22, and employed in making the appropriate connections between the computer or data processor 3 and the computer controlled, electrically operated components of the printer-etcher unit 2. Further, the unit 2 includes a pair of liquid holding tanks, one being an etchant liquid holding tank 24 and the other a rinse liquid holding tank 29 mounted in side-by-side position. The tanks 24,29 have appropriate pumps 23,30 respectively for pumping liquid from those tanks to a common liquid applicator tank or tube 25, underlying the printer 21. Pumps 23, 30 are preferably positive displacement, motor driven pumps whose parts in contact with the liquids formed of corrsion resistant plastic. Tank 25 is positioned horizontally within the unit 2, overlying the metalized film 19 as fed into the etching chamber 32 after passing by the printer 21. The applicator tank 25 is of cylindrical form, is closed at its ends and receives selectively etching liquid 31 from the etching liquid holding tank 24 and rinse liquid 28 from the rinse liquid holding tank 29, via vertically oriented feed tubes 26,27 respectively. The feed tubes 26, 29 are on opposite sides of the unit and have their lower ends 26a,27a disposed respectively within the tanks 24,29. Their upper ends 26b,27b, which are bent into U-shape, open into the top of the applicator tank 25. The applicator tank 25 may include a plurality of small, in line, pinhole perforations or nozzles 25a within the bottom of the tank, such that droplets or spray D of the liquid fall onto the upper surface 19a of the metalized film 19, by gravity during film transport downwardly at an inclined angle via the transport or conveyor mechanism 20 within etching chamber 32.

The front wall 13 of the cabinet includes a glass or a plastic window W to define a viewing area for viewing the surface 19a of the metalized film 19 after resist printing with a resist coating R, during the application of first the etching liquid or etchant 31 from the etchant liquid holding tank 24 thereon and subsequently, the rinse liquid 28 from the rinse liquid holding tank 29 via the applicator tube 25. The supply tubes 26,27 are integrated into the respective pumps 23,30. In FIGS. 1 and 2, pump 23 is shown in operation with droplets D of the etching liquid 31 replacing the etchant liquid 31 leaving the applicator tank 25 via perforations 25a. The metalized film is preferably provided with sprocket holes along both side edges with the sprocket holes receiving radially projecting pins (not shown) on the various sprockets or wheels 33 which engage the regular spaced sprocket holes within the edges of film 19.

FIG. 1 illustrates schematically a number of sprockets 33 defining a metalized film path as indicated in dotted lines at 34 and which path 34 extends downwardly from slot 16 within the cabinet 9 through seals 17, and about the uppermost sprockets 33 where the path changes from vertical to downwardly oblique and parallel to the plane of the viewing window W. The path 34 is further defined by two additional sets of sprockets 33 near the bottom of window W where the film movement direction is reversed. The film 19 may be guided by fixed or laterally adjustable guides engaging the lateral edges of the film employed in the subject invention. Alternatively, the metalized film may be transported by endless belt conveyors, or by a conveyor system using pinch rolls, pinching opposite faces of the metalized film 19.

The unit 2 is provided with a back lighting fixture 36 for illuminating the surface of the metalized film viewed through a viewing window W.

The etching chamber 32 is of a narrower width than the cabinet 9 as seen in FIG. 2. Chamber 32 may consist in part of cabinet front wall 13, laterally spaced chamber sidewalls 37 and 38, a chamber top wall 39, chamber bottom wall 40 and chamber rear wall 41. The etching chamber 32 is essentially closed except for a first drain hole 42 within chamber bottom wall 40, leading into the etchant liquid holding tank 24 and a second drain hole 43 leading into the rinse liquid holding tank 32. Fixedly mounted above the respective holes 42 and 43 are a pair of stopper solenoids indicated generally at 44, 45 respectively. Etchant stopper solenoid 44 is above the etchant liquid holding tank 31 and rinse stopper solenoid 45 is above the rinse liquid holding tank 32.

The stopper solenoids, each include a solenoid coil 46, concentric about an axially displaceable plunger 47 and having fixed thereon a stopper or plug 48. Each plug 48 has its outer periphery tapered so as to seat within a drain hole 42,43 for respective stopper solenoids 44,45. The plungers 47 are spring-biased to valve closed position such that by energizing the solenoid coils 46 the plugs are raised to permit any liquid accumulating within the bottom of the etching chamber 32 to gravity drain into either the etchant liquid holding tank 24 or the rinse liquid holding tank 29 depending upon which stopper solenoid is energized. Additionally, each liquid holding tank 24, 29, is provided with a filling nozzle 48 and cap 50 permitting the tanks to be filled to a desired level with the etchant liquid or rinse liquid respectively. Additionally, each of the liquid holding tanks 24, 29 is provided with an integral valved drain 51 having a closable valve 52 permitting the circulating rinse and etching liquids to be periodically replaced due to contamination or deterioration of the active materials making up those liquids.

A control panel or unit 53 is mounted adjacent the front wall and above the bottom wall 11 of the cabinet 9. The control panel 53 may include externally accessible control knobs, buttons, switches or the like (not shown) for setting up the printer-etcher unit 2 for operation controlled principally by input from the computer or data processor 3 through keyboard 4.

While the pumps 23,30, the printer 21 and the conveyor system drive motor 35 have been shown schematically, the electrical connections therebetween and interfaced with the electronics interface unit 22 have been purposely deleted for clarity in the schematic FIGS. 1 and 2. It is believed, however, on the basis of the description of the components and the description of the operation of the system, the connection through the interface necessary to accomplish the action desired will be appreciated without a detailed description of the electrical connections between a power source and the system electrical or electronic components.

Figure 5:
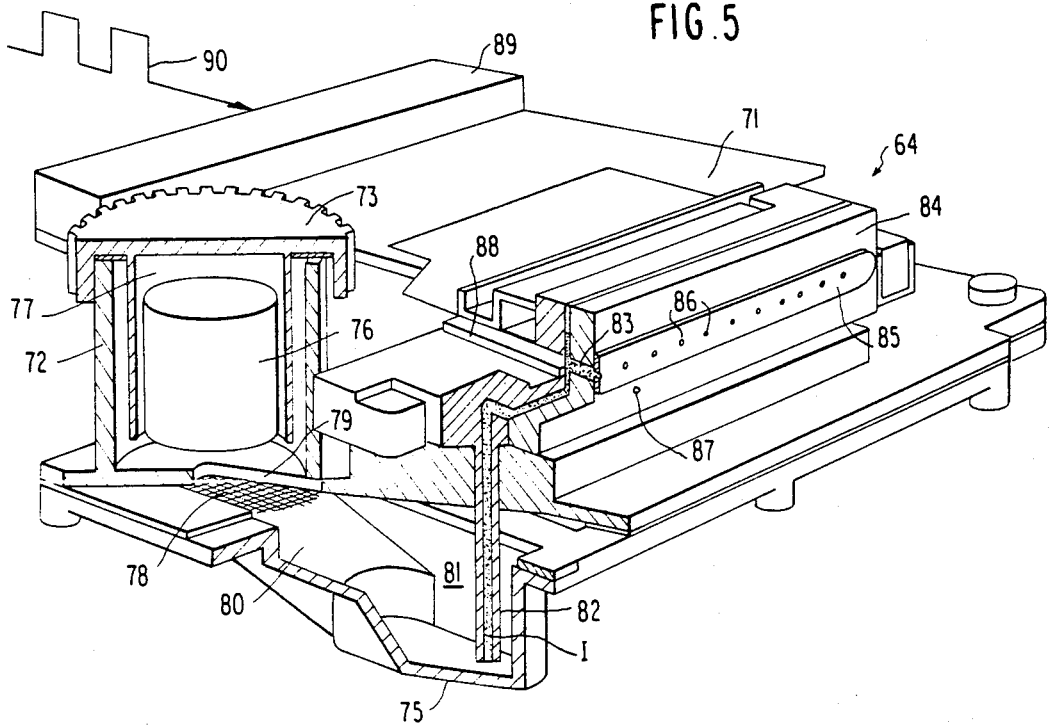
FIG. 5 is an enlarged, perspective view, partially broken away, of a preferred print head forming a major component of the printed circuit prototyper.

FIGS. 3, 4 and 5 show in detail, major components of the printer 21. In that respect, in FIGS. 3 and 4 a pair of laterally spaced rails 60 are shown as being fixed to and supported by brackets 61 at their opposite ends. The brackets 61 include paired risers 62 which physically support the rails at some distance above a bracket base plate 63 for each bracket. In turn, the rails which extend transversely from side to side of the unit 2, near the top of cabinet 9, slideably mount a print head, indicated generally at 64, in overlying fashion via a pair of yokes 65, which descend from the print head 64 and which straddle both rails 60 at opposite ends. In order to physically move the print head on the support rails, the printer employs an endless tape or band 66. Band 66 is fixed to the print head 64 at opposite ends. FIG. 3 and is trained about pulleys 67,68 at opposite end of the rails. The pulleys 67, 68 are mounted outside of the brackets 61 for rotation about axles 69. The pulley 67 is an idler, while puller 68 is positively driven by a DC servo motor 70 via axle 69. Axle 69 forms a direct drive from motor 70 to pulley 68. Alternatively, a gear reduction unit may be used to provide the requisite velocity for lateral movement of the print head 64 across the front face 19A of the metalized film 19, FIG. 1. Printer 21 may include an optical timing track and photosensor (not shown) integrated to the electronics 22 to regulate motor speed of motor 70 and to determine exact head position.

In the perspective view of the print head 64, FIG. 5 which is partially broken away, the principal components of the preferred print head are labeled. The print head body 71 includes integrally, a ink pellet container 72 of cylindrical form which is open at the top, and which is covered by a suitable, removeable cap 73. The body 71 of the print head is also provided with a heated reservoir 75 which carries a mass of the liquid ink I for selective point application to the metalized film. The "ink-melt" type printer 21 may include a commercially available print head 64 as shown in FIG. 5, manufactured by Data Products Corporation and sold under model designation SI 480. As such, the ink-melt type printer effects melting of a wax or thermal plastic material which may take the form of ink pellet 76 within the pellet chamber 77 of container 72 and delivers ink I to the print substrate (surface 19a of the metalized film 19) as microscopic dots which later cool on the substrate to lock out the etchant 31 from the etchant liquid holding tank 24. This type of printer, employing print head 64 can deliver up to 300 dots per inch. Upon melting of the ink pellet 76, the liquid Ink I flows through filter 78, via an opening 79 within the bottom of the ink pellet chamber 77 and falls down the bottom sloped wall 80 into sump 81 of the heated reservoir 75. A vertical tube 82, which may be a capillary tube, feeds the ink upwardly from the heated reservoir sump 81 to compression chamber 83 within the front face block 84 of the print head body 71. The block 84 is provided with a orifice plate 85, having a series of horizontal, longitudinally spaced orifices 86 in the form of fine, small diameter pin holes which act as jet nozzles to eject ink droplets 87 as a result of momentary pressurization of the ink I in compression chamber 83 supplied with the ink from the reservoir. The pressure in the compression chamber is created by electrical energization of a piezolectric transducer 88, which interfaces with the electronics package 22 via a suitable electrical connector 89. Upon the receipt of a generated print signal 90, the piezolectric electric transducers create sufficient compression within the compression chamber 83 associated with orifices 86 within the orifice plate 85 to instantly eject ink droplets 87.

In conjunction with the use of the printer etcher unit of the invention, it is envisioned that the ink-jet print head 64 is capable of delivering ink from an ink pellet. Alternatively, another print head could deliver a water-based plastic such as PHENOSEAL (registered trademark of Glouster Company, Inc., Franklin, Mass.) which when dried is capable of excluding water-based etchants such as feric chloride or sodium peroxydisulfate. Solvent based waxes could be employed. The ink droplets 87 are air dried on face 19a of the metalized film 19. They form a resist coating R seen schematically in FIG. 1. With respect to the metalized film 19, that print substrate is in the form of a thin plastic base which is coated with a conductive material. Copper coated polyester or copper-coated KAPTON (registered trademark of DuPont) are readily available in various thicknesses from manufactures such as Sheldahl of Northfield, Minn. This material is conventionally used for producing flexible printed circuits. compression chamber 83 supplied with the ink from the reservoir. The pressure in the compression chamber is created by electrical energization of a piezoelectric transducer 88, which interfaces with the electronics package 22 via a suitable electrical connector 89. Upon the receipt of a generated print signal 90, the piezoelectric electric transducers create sufficient compression within the compression chamber 83 associated with orifices 86 within the orifice plate 85 to instantly eject ink droplets 87.

In conjunction with the use of the printer etcher unit of the invention, it is envisioned that the ink-jet print head 64 is capable of delivering ink from an ink pellet. Alternatively, another print head could deliver a water-based plastic such as PHENOSEAL (registered trademark of Glouster Company, Inc., Franklin, Mass.) which when dried is capable of excluding water-based etchants such as feric chloride or sodium peroxydisulfate. Solvent based waxes could be employed. The ink droplets 87 are air dried on face 19a of the metalized film 19. They form a resist coating R seen schematically in FIG. 1. With respect to the metalized film 19, that print substrate is in the form of a thin plastic base which is coated with a conductive material. Copper coated polyester or copper-coated KAPTON (registered trademark of DuPont) are readily available in various thicknesses from manufactures such as Sheldahl of Northfield, Minn. This material is conventionally used for producing flexible printed circuits.

Alternatively, an impact printer may be employed which transfers wax from a wax impregnated ribbon to the print substrate; (metalized film 19) the important feature being the capability of applying rapidly and under close control, a resist material capable of preventing etching by the etchant, of the metal layer on the metalized film sheet 19 when subjected to the etchant bath within the etching chamber 32.

In operation, a sheet metalized plastic film 19 is inserted into the printer etcher unit 2 with the metal surface 19a facing the printer 21. The computer or data processor 3 is keyed through keyboard 4 to deliver information concerning the desired resist pattern to be printed on the metal surface to the printer etcher unit 2. Once activated, the printer-etcher 2 commences the "print phase" of operation.

In the "print phase", the printer assembly deposits a resist material R such as not melted wax or plastic onto the copper surface of the copper coated polyester, for example. The resist R is impervious to the chemicals of the etchant 31 within etchant liquid holding tank 24. As printing proceeds, the film progresses along the film path 34 moving into the etching chamber 32 and the viewing area V, FIG. 2, as defined by the window W, FIG. 1. When the entire piece of metalized film 19 has been printed with a desired resist pattern and is positioned in the etching chamber 32, the "etch phase" is initiated, through the electronics package 22, control panel 53, or a combination of both.

This is the step illustrated in FIGS. 1 and 2 wherein the stopper solenoid 44 is energized while stopper solenoid 45 is deenergized so that any etching liquid entering the etching chamber 32 can drain back into the etchant liquid holding tank 24. With the other stopper solenoid 45 is deactivated, its stopper plug 48 prevents any liquid from draining into the rinse liquid holding tank 29. Further, via the control panel 53 or the electronics package 22, or a combination thereof, pump 23 is energized to pump the etchant 31 from the etchant liquid holding tank 24 through supply pipe 25 to the applicator tank 25. The etchant 31 drains out of the applicator tube 25 via the small holes or perforations 25a (or in an equivalent manner) so as to uniformly coat the metal surfaces 19A of metalized film 19. The etchant 31 runs over the surface of the film 19 and runs off the bottom of that film as drops D, FIGS. 1 and 2. The etchant 31 reacts with the exposed metal (copper) as it runs down the surface 19A of film 19 but does not react with any of the metal which is covered by the dot printed resist material R. This phase continues for a predetermined period of time stored in the memory of the computer or data processor 3, or until an operator terminates it, either by keyboard input 4 or via the control panel 53. When etching is complete, the "rinse phase" commences with the metalized film 19 still in place.

In this phase, the etchant stopper solenoid 44 is deenergized after all remaining etchant has a chance to drain into the etchant liquid holding tank 24 via drain hole 42. The etchant stopper plug 47 closes hole 42 by seating on the edge of hole 42, preventing liquid from entering the etching holding tank 24. The rinse stopper solenoid 27 is then activated by energizing coil 46 of that solenoid, whereupon its plunger 47 is retracted against its bias and the rinse stopper plug 48 is raised from the position shown in FIG. 2. Simultaneously the pump 30 associated with the rinse liquid holding tank 29 is energized causing the rinse liquid 28 to rise within the supply pipe 27, discharging into the applicator tank 25 and being dispensed thereby through the pin holes 25a within the bottom of that tank in the same manner as the etching liquid was previously applied to the surface of the metalized film. The rinse liquid drains over the film neutralizing any remaining etchant. The rinse liquid 28 runs down the surface 19a of the film 19 and drains into the rinse liquid holding tank from bottom wall 40 of the etching chamber 32. When rinsing is completed, the piece of film 19 is advanced along the film path 34 guided by guide tracks (not shown) and driven by paired sprockets 33 engaging opposite side edges of the film 19 until it emerges from the front wall 13 of the printer-etcher housing 9 through exit slot 18 between the seals 17 within the front wall 13. The seals 17 within the front wall 13 function as wipers to help remove excess rinse liquid 28 from the film 19 as it moves out of the etching chamber 32. When the rinse liquid 28 has adequate time to drain from the etching chamber 32, the rinse stopper solenoid coil 46 is deenergized, and plug 48 of that solenoid is closed under its bias. The printer etcher unit 2 is ready for another piece of film 19 or to be loaded into the unit 2 and placed in front of the printer 21.

The metalized film 19 may be then punched and components can be soldered to it or alternatively, metal pins may be inserted through the holes in the film. Further, the film 19 may be laminated to a further insulation material substrate to proclude a rigid printed circuit board if desired. The techniques in further treating the printed circuit film 19 after passage through the printer-etcher unit of this invention are conventional.

The invention, as described is to a highly suitable technique using present day printer technology depositing printed patterns on a conductive-coated flexible film substrate such as a copper-coated polyester film which is subsequently and immediately etched within the unit with an etchant such as ferrite chloride or sodium peroxide disulphate to remove unwanted conductor material to produce a prototype printed circuit. Further, subject to tests of the prototype circuit, minor modifications can be readily made to complete a satisfactory prototype printed circuit with minimal time in reaching the desired circuit pattern for subsequent reproduction in commercial form using conventional technology, after the prototype is fixed.

While the invention has been particularly shown and described with reference to a preferred embodiment thereof, it will be understood by those skilled in the art that various changes in form and details and application may be made therein without departing from the spirit and scope of the invention.

What is claimed:

1. A computer aided printer-etcher for controlled printing of a resist pattern on a metalized film and subsequent etching of the metalized surface thereof, said printer etcher utilizing:

a computer having a keyboard, a memory and a display panel, said printer-etcher comprising; a cabinet, an upright etching chamber within said cabinet, a metalized film conveyor within said cabinet defining a conveyor film path leading into, through and out of said cabinet for said metalized film, said conveyor path including a vertically oblique portion within said etching chamber, a high speed printer along said conveyor film path upstream of said etching chamber including means for printing a resist ink pattern onto said metalized surface of said metalized film, liquid applicator means along said conveyor film path and within said etching chamber and facing the metal surface of said metalized film for applying, in sequence, an etching liquid and a rinse liquid onto the metalized face of said metalized film, an etchant liquid holding tank having an etching liquid therein and a rinse liquid holding tank having a rinse liquid therein within said cabinet, and means for selectively pumping said etching liquid and said rinse liquid from respective holding tanks to said liquid applicator means for application of etching liquid and rinse liquid in sequence to said metal surface of said metalized film for passage over said metalized film and means for returning said etching liquid and said rinse liquid to respective etchant liquid and rinse liquid holding tanks, and control means responsive to signals from said computer keyboard and/or said memory for controlling operation of and power supply to said conveyor, said high speed printer, said pump means and said return means.

2. The computer aided printer-etcher as claimed in claim 1, wherein said etchant liquid holding tank and said rinse holding tank are positioned side by side beneath said etching chamber, said printer is positioned above said etching chamber, said etching chamber includes a bottom wall having a pair of drain holes therein opening respectively into the top of said etchant liquid holding tank and said rinse liquid holding tank, respectively and said unit further comprises selectively operable stoppers for selectively plugging said drain holes.

3. The computer aided printer-etcher as claimed in claim 1, wherein said cabinet includes a top wall and a front wall, said top wall includes a horizontal film entry slot, said etching chamber is integrated to the front wall of said cabinet and includes a top wall, a first pair of side by side horizontal seals within said etching tank top wall forming a slot in line with the film entry slot within said cabinet top wall, and said common cabinet and etching chamber front wall comprise a second pair of side by side horizontal seals forming a film exit slot therebetween and wherein, said conveyor means comprises means aligned with the slots between said pairs of seals whereby said metalized film, when inserted into the film entry slot, extends vertically past the printer and enters the interior of the etching chamber through said first pair of seals and engages said conveyor means for movement through said etching chamber, is driven by said conveyor means, and discharges through said film exit slot within the common front wall of said cabinet and said etching chamber.

4. The computer aided printer etcher as claimed in claim 1, further comprising a window within said cabinet front wall facing the oblique portion of the conveyor path within said etching chamber, below said applicator means, to permit viewing of the metalized surface of said metalized film during operation of said applicator means and contact of the etching liquid and the rinse liquid in sequence with the metalized surface of said metalized film.

5. The computer aided printer-etcher as claimed in claim 1, further comprising lighting means internally of said cabinet on the side of said metalized film remote from said window, to the rear of the etching chamber, to facilitate viewing of the resist imprinted metalized film during application of the etching liquid and rinse liquid by said applicator means.

6. The computer aided printer-etcher as claimed in claim 1, wherein, said etchant liquid holding tank and said rinse liquid holding tank are mounted side by side within said cabinet, beneath the etching chamber, and wherein, said applicator means comprises a cylindrical applicator tank having a horizontal axis, being of a length on the order of the width of said etching chamber, each of said etchant liquid holding tank and said rinse liquid holding tank supporting a supply tube with one end positioned interiorly of said tank extending vertically upwardly therefrom and terminating in a reverse bent end opening to the interior of the cylindrical applicator tank and wherein, said pump means comprises pumps integrated respectively to said supply tubes such that by selective energization of said pumps, the etching liquid may be pumped from the etchant liquid holding tank or said rinse liquid holding tank into the interior of the applicator tank, and wherein, said applicator tank includes a line of pin holes within the bottom thereof overlying the path of movement of said metalized film on said conveyor means, such that liquid falls onto the metalized film within the oblique portion of said transport path by gravity escape from the interior of the applicator tank through said pin holes or nozzles in droplet or spray form and flows over the metalized surface of said metalized film.

7. The computer aided printer-etcher as claimed in claim 2, wherein said stoppers comprise stopper solenoids mounted within said etching chamber, having a spring biased plunger coaxial with a respective liquid drain hole and terminating in peripherally tapered plug positioned such that when deenergized, the plug seats on a respective drain hole.

8. The computer aided printer-etcher as claimed in claim 1, wherein said printer rests on the top of said etching tank, and wherein, said applicator chamber underlies said printer.

9. The computer aided printer-etcher as claimed in claim 1, wherein said printer comprises an ink-jet printer including at least one line of minute horizontally spaced ink-jet orifices facing the metalized surface of the metalized film as said film moves along said conveyor path driven by said conveyor means.

10. The computer aided printer-etcher as claimed in claim 9, wherein said ink-jet printer comprises an ink melt printer and wherein said resist comprises a meltable wax or thermoplastic material such that the resist material is molten during jet application and cools to solidify on the substrate to lock out the etchant.

11. The computer aided printer-etcher as claimed in claim 1, wherein said applicator chamber underlies said printer.

12. The computer aided printer-etcher as claimed in claim 1, wherein said printer comprises an ink-jet printer including at least one line of minute ink-jet orifices facing the metalized surface of the metalized film as said film moves along said conveyor path driven by said conveyor means.

13. The computer aided printer-etcher as claimed in claim 12, wherein said ink-jet printer comprises an ink melt printer and wherein said resist comprises a comprises a resist material which adheres to a metalized surface so as to lock out the etchant.

14. A computer aided printer-etcher for controlled printing of a resist pattern on a metalized film and subsequent etching of the metalized surface thereof, said printer etcher utilizing:
   a computer having a keyboard, a memory and a display panel,
   said printer-etcher comprising; a cabinet, an upright etching chamber within said cabinet, a metalized film conveyor without said cabinet defining a conveyor film path leading into, through and out of said cabinet for said metalized film, said conveyor path including an inclined portion within said etching chamber, a printer along said conveyor film path upstream of said etching chamber including means for printing a resist ink pattern onto said metalized surface of said metalized film, liquid applicator means along said conveyor film path and within said etching chamber and facing the metal surface of said metalized film for applying, in sequence, an etching liquid and a rinse liquid onto the metalized face of said metalized film, an etchant liquid holding tank having an etching liquid therein and a rinse liquid holding tank having a rinse liquid therein, and means for selectively pumping said etching liquid and said rinse liquid from respective holding tanks to said liquid applicator means for application of etching liquid and rinse liquid in sequence to said metal surface of said metalized film for passage over said metalized film and means for returning said etching liquid and said rinse liquid to respective etchant liquid and rinse liquid holding tanks, and control means responsive to signals from said computer keyboard and/or said memory for controlling operation of and power supply to said conveyor, said printer, said pump means and said return means.

15. The computer aided printer-etcher as claimed in claim 14, wherein said etchant liquid holding tank and said rinse holding tank are positioned below said etching chamber, said etching chamber includes a bottom wall having at least one drain hole therein and means coupled to said at least one drain hole, for directing used etchant liquid to said etchant liquid holding tank and used rinse liquid to said rinse liquid holding tank.

16. The computer aided printer-etcher as claimed in claim 14, wherein said cabinet includes a top wall and a front wall, said top wall includes a horizontal film entry slot, said etching chamber is integrated to the front wall of said cabinet and includes a top wall, a first pair of side by side horizontal seals within said etching tank top forming a slot in line with the film entry slot within said cabinet top wall, and said common cabinet and etching chamber front wall comprise a second pair of side by side horizontal seals forming a film exit slot therebetween and wherein, said conveyor means comprises means aligned with the slots between said pairs of seals whereby said metalized film, when inserted into the film entry slot, extends and enters the interior of the etching chamber through said first pair of seals and engages said conveyor means for movement through said etching chamber, is driven by said conveyor means, and discharges through said film exit slot within the common front wall of said cabinet and said etching chamber.

17. The computer aided printer etcher as claimed in claim 14, further comprising a window within said cabinet front wall facing the film on the conveyor path within said etching chamber, below said applicator means, to permit viewing of the metalized surface of said metalized film during operation of said applicator means and contact of the etching liquid and the rinse liquid in sequence with the metalized surface of said metalized film.

18. The computer aided printer-etcher as claimed in claim 14, further comprising lighting means internally of said cabinet on the side of said metalized film remote from said window, to the rear of the etching chamber, to facilitate viewing of the resist imprinted metalized film during application of the etching liquid and rinse liquid by said applicator means.

19. The computer aided printer-etcher as claimed in claim 14, wherein, said etchant liquid holding tank and said rinse liquid holding tank are mounted within said cabinet, beneath the etching chamber, and wherein, said applicator means comprises a cylindrical applicator tank having a horizontal axis, being of a length on the order of the width of said etching chamber, each of said etchant liquid holding tank and said rinse liquid holding tank supporting a supply tube with one end positioned interiorly of said tank extending upwardly therefrom and terminating in a reverse bent end opening to the interior of the cylindrical applicator tank and wherein, said pump means comprises pumps integrated respectively to said supply tubes such that by selective energization of said pumps, the etching liquid may be pumped from the etchant liquid holding tank or said rinse liquid holding tank into the interior of the applicator tank, and wherein, said applicator tank includes a line of holes within the bottom thereof overlying the path of movement of said metalized film on said conveyor means, such that liquid falls onto the metalized film moving along said transport path by gravity escape from the interior of the applicator tank through said holes in droplet or spray form and flows over the metalized surface of said metalized film.

20. The computer aided printer-etcher as claimed in claim 14, wherein said printer comprises an ink-jet printer including at least one line of minute ink-jet orifices facing the metalized surface of the metalized film as said film moves along said conveyor path driven by said conveyor means.

21. The computer aided printer-etcher as claimed in claim 12, wherein said ink-jet printer, and wherein, said resist comprises a resist material which adheres to a metalized surface so as to lock out the etchant.

* * * * *